(12) United States Patent
Howard et al.

(10) Patent No.: US 11,011,722 B1
(45) Date of Patent: May 18, 2021

(54) ELECTROLUMINESCENT PAINT INDICATOR FOR A FAULT OR FAILURE

(71) Applicant: Rockwell Collins, Inc., Cedar Rapids, IA (US)

(72) Inventors: Sean D. Howard, Cedar Rapids, IA (US); Jacob E. Cannon, North Liberty, IA (US); Gabriel W. Schive, Marion, IA (US); Julie M. Byrd, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/817,368

(22) Filed: Mar. 12, 2020

(51) Int. Cl.
*H01L 51/50* (2006.01)
*C09K 11/02* (2006.01)

(52) U.S. Cl.
CPC ............ *H01L 51/504* (2013.01); *C09K 11/02* (2013.01); *H01L 51/5096* (2013.01)

(58) Field of Classification Search
CPC .... H01L 51/504; H01L 51/5096; C09K 11/02
See application file for complete search history.

(56) References Cited

U.S. PATENT DOCUMENTS

| | | | |
|---|---|---|---|
| 6,564,620 B1 * | 5/2003 | Jaeger | G01N 17/04 73/86 |
| 7,036,770 B2 | 5/2006 | Shelly et al. | |
| 7,244,500 B2 * | 7/2007 | Watts | G02F 1/15 428/408 |
| 7,938,012 B2 * | 5/2011 | Lv | G01L 1/20 73/776 |
| 8,409,524 B2 | 4/2013 | Farmer et al. | |
| 8,409,525 B1 | 4/2013 | Farmer | |
| 10,438,490 B1 | 10/2019 | Desai et al. | |
| 2015/0360604 A1 | 12/2015 | Cameron et al. | |

* cited by examiner

*Primary Examiner* — Anne M Hines
(74) *Attorney, Agent, or Firm* — Suiter Swantz pc llo

(57) ABSTRACT

An electroluminescent paint indicator for a fault or failure may include at least one layer of electrically conductive paint disposed on a surface within a system including the electroluminescent paint indicator, at least one dielectric layer disposed on the at least one layer of electrically conductive paint, at least one layer including an electroluminescent phosphor compound disposed on the at least one dielectric layer, and at least one layer of conductive coating disposed on the at least one layer including the electroluminescent phosphor compound. The electroluminescent paint indicator may be configured to activate following a determination of a fault or failure with the at least one layer of electrically conductive paint receiving power, the at least one layer including the electroluminescent phosphor compound being excited by the at least one layer of electrically conductive paint, and the least one layer including the electroluminescent phosphor compound generating an illuminated light.

15 Claims, 9 Drawing Sheets

ELECTROLUMINESCENT PAINT INDICATOR FOR A FAULT OR FAILURE

BACKGROUND

Fault or failure detection in airborne systems and/or automotive systems is becoming increasingly complex. Despite the increasing complexity, however, mechanisms for the detected faults or failures may be limited. In addition, the detected faults or failures may be impacted or inhibited by the fault or failure itself.

SUMMARY

An electroluminescent paint indicator for a fault or failure is disclosed, in accordance with one or more embodiments of the disclosure. The electroluminescent paint indicator may include at least one layer of electrically conductive paint disposed on a surface within a system including the electroluminescent paint indicator. The electroluminescent paint indicator may include at least one dielectric layer disposed on the at least one layer of electrically conductive paint. The electroluminescent paint indicator may include at least one layer including an electroluminescent phosphor compound disposed on the at least one dielectric layer. The electroluminescent paint indicator may include at least one layer of conductive coating disposed on the at least one layer including the electroluminescent phosphor compound. The electroluminescent paint indicator may be configured to activate following a determination of a fault or failure within the system including the electroluminescent paint indicator. The activating of the electroluminescent paint indicator may include the at least one layer of electrically conductive paint receiving power. The activating of the electroluminescent paint indicator may include the at least one layer including the electroluminescent phosphor compound being excited by the at least one layer of electrically conductive paint following the receiving of power. The activating of the electroluminescent paint indicator may include the least one layer including the electroluminescent phosphor compound generating an illuminated light following the exciting the at least one layer including the electroluminescent phosphor compound.

In some embodiments, the electroluminescent phosphor compound may include an electroluminescent phosphor powder and a varnish base.

In some embodiments, the electroluminescent phosphor powder may be mixed into the varnish base prior to being disposed on the at least one dielectric layer.

In some embodiments, the at least one layer of conductive coating may be electrically coupled to a ground bus. The at least one layer of electrically conductive paint may be electrically coupled to an inverter. The ground bus and the inverter may be electrically coupled via a power signal. The at least one layer of electrically conductive paint may be configured to receive power via the power signal.

In some embodiments, the system may include one or more sensor components. The one or more sensor components may be configured to monitor the system to determine the fault or failure within the system.

In some embodiments, the one or more sensor components may be configured to interact with the electroluminescent paint indicator.

In some embodiments, the one or more sensor components may be configured to interact with a controller. The controller may be configured to interact with the electroluminescent paint indicator.

In some embodiments, the system may include one or more subsystems.

In some embodiments, the at least one layer of electrically conductive paint may be disposed on a surface of the system. The electroluminescent paint indicator may correspond to a select subsystem of the one or more subsystems. The least one layer including the electroluminescent phosphor compound may be configured to generate the illuminated light in response to the excitation by the at least one layer of electrically conductive paint following the determination of a fault or failure in the select subsystem.

In some embodiments, the at least one layer of electrically conductive paint may be disposed on a surface of a select subsystem of the one or more subsystems. The least one layer including the electroluminescent phosphor compound may be configured to generate the illuminated light in response to the excitation by the at least one layer of electrically conductive paint following the determination of a fault or failure in the select subsystem.

In some embodiments, the system may include one or more components installed within a select subsystem of the one or more subsystems.

In some embodiments, the at least one layer of electrically conductive paint may be disposed on a surface of the system. The electroluminescent paint indicator may correspond to a select component of the one or more components. The least one layer including the electroluminescent phosphor compound may be configured to generate the illuminated light in response to the excitation by the at least one layer of electrically conductive paint following the determination of a fault or failure in the select component.

In some embodiments, the at least one layer of electrically conductive paint may be disposed on a surface of the select subsystem. The electroluminescent paint indicator may correspond to a select component of the one or more components. The least one layer including the electroluminescent phosphor compound may be configured to generate the illuminated light in response to the excitation by the at least one layer of electrically conductive paint following the determination of a fault or failure in the select component.

In some embodiments, the at least one layer of electrically conductive paint may be disposed on a surface of a select subsystem of the one or more subsystems. The least one layer including the electroluminescent phosphor compound may be configured to generate the illuminated light in response to the excitation by the at least one layer of electrically conductive paint following the determination of a fault or failure in the select subsystem.

A method is disclosed, in accordance with one or more embodiments of the disclosure. The method may include, but is not limited to, determining a fault or failure within a system. The system may include an electroluminescent paint indicator disposed on a surface within the system. The method may include, but is not limited to, applying electric power to the electroluminescent paint in response to the determination of the fault or failure in the system. The method may include, but is not limited to, generating an illuminated light via at least one layer including an electroluminescent phosphor compound of the electroluminescent paint following the applying of the electric power and an exciting of the at least one layer including the electroluminescent phosphor compound of the electroluminescent paint.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are examples and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION OF THE INVENTION

Figure 1A:
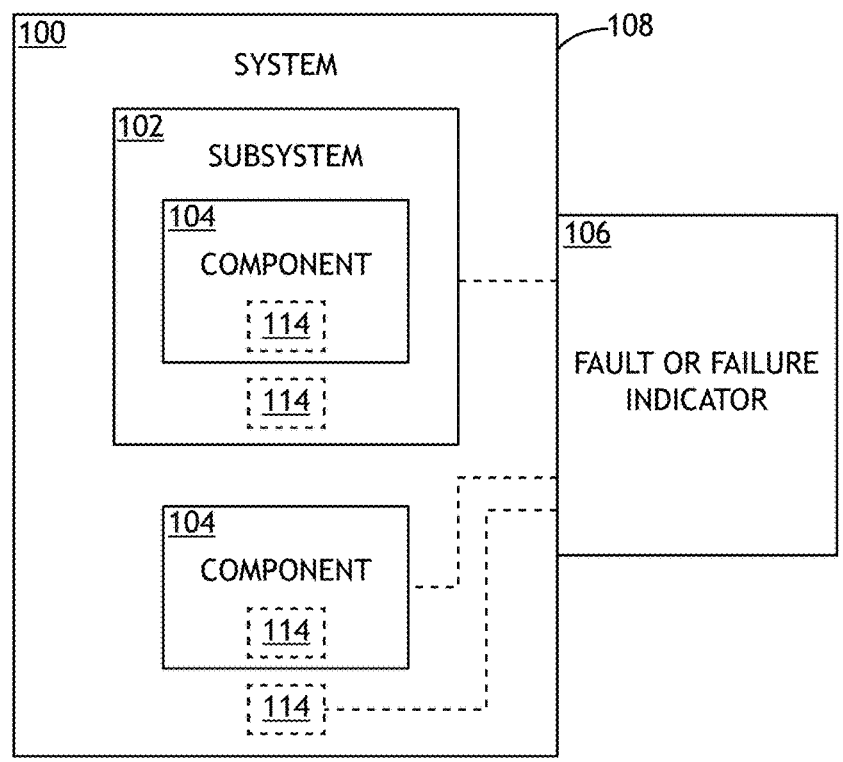
FIG. 1A is a block diagram of a system including an electroluminescent paint indicator for a fault or failure, in accordance with one or more embodiments of the disclosure.

Reference will now be made in detail to the subject matter disclosed, which is illustrated in the accompanying drawings.

Before explaining one or more embodiments of the disclosure in detail, it is to be understood the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

FIGS. 1A-5B generally illustrate a system 100 including an electroluminescent paint indicator for a fault or failure, in accordance with one or more embodiments of the disclosure.

Fault or failure detection in airborne systems and/or automotive systems is becoming increasingly complex. For example, the airborne systems and/or the automotive systems may include numerous subsystems, components, or the like (e.g., elements of the airborne systems and/or the automotive systems), about which information related to health and/or operation may be received, aggregated, and/or outputted to other elements of the airborne systems and/or automotive systems.

Despite the increasing complexity, however, mechanisms for the detected faults or failures may be limited. For example, the mechanisms may include a graphical, auditory, or visual indicator for fault detection, the graphical, auditory, or visual indicator including, but not being limited to, one or a series of solid or blinking lights (e.g., a graphically-displayed light, a hardware-based light-emitting diodes (LEDs), or the like), a check engine light, a small-digit code generator and display device, or other graphical, auditory, or visual indicator.

In addition, the detected faults or failures may be impacted or inhibited by the fault or failure itself. For example, a hardware failure in a communication system (e.g., a network) between a monitored component and a health monitoring system may impact or inhibit the fault or failure.

Failing to monitor for faults or failure, or at least not quickly and/or easily monitoring for faults or failure, may increase a Mean Time to Repair (MTTR) should a fault or failure develop. In this regard, it would be beneficial to provide an indicator to improve the Mean Time to Repair should a fault or failure develop. For example, it would be beneficial if the indicator were not affected by a hardware failure. By way of another example, it would be beneficial if the indicator were visible at the site of the fault or failure. By way of another example, it would be beneficial if the indicator were visible proximate to the fault or failure. By way of another example, it would be beneficial if the indicator were visible a select distance from the fault or failure.

The system 100 may include any stationary system. For example, the stationary system may include, but is not limited to, a structure or a component configured to be attached to a structure. For instance, the structure may include, but is not limited to, a residential, commercial or industrial, or military establishment such as a home, a business, storage building, military building, or the like; a remote range device; or the like.

The system 100 may include any non-stationary system. For example, the non-stationary system may include, but is not limited to, a vehicle or a component configured to be attached to a vehicle. For instance, the vehicle may be any air, space, land, or water-based personal equipment or vehicle; any air, space, land, or water-based commercial or industrial equipment or vehicle; any air, space, land, or water-based military equipment or vehicle; or the like.

The system 100 may include one or more subsystems 102. For example, the one or more subsystems 102 may include one or more areas (e.g., pods, rooms, cabins, engine bays, defined cavities, or the like) within the system 100.

The system 100 may include one or more components 104. For example, the one or more components 104 may include modules, one or more connectors of the one or more modules, one or more cables coupled to the one or more connectors of the one or more modules, or the like. The one or more components 104 may be components of the one or more subsystems 102. The one or more components 104 may be components of the one or more system 100.

It is noted herein that the one or more subsystems 102 and/or the one or more components 104 may be considered elements of the system 100, for the embodiments of the disclosure.

The system 100 may include a fault or failure indicator 106. The fault or failure indicator 106 may be applied to (or disposed on) a surface 108 of the system 100. The fault or failure indicator 106 may be applied to (or disposed on) a surface 110 of a subsystem 102 within the system 100. The fault or failure indicator 106 may be applied to (or disposed on) a surface 112 of a component 104 within the system 100.

The fault or failure indicator 106 may include, but are not limited to, one or more visual indicators (e.g., one or more lights), one or more graphical indicators displayed on a screen, one or more auditory indicators (e.g., one or more sounds emitted from a speaker), or the like.

Figure 2A:
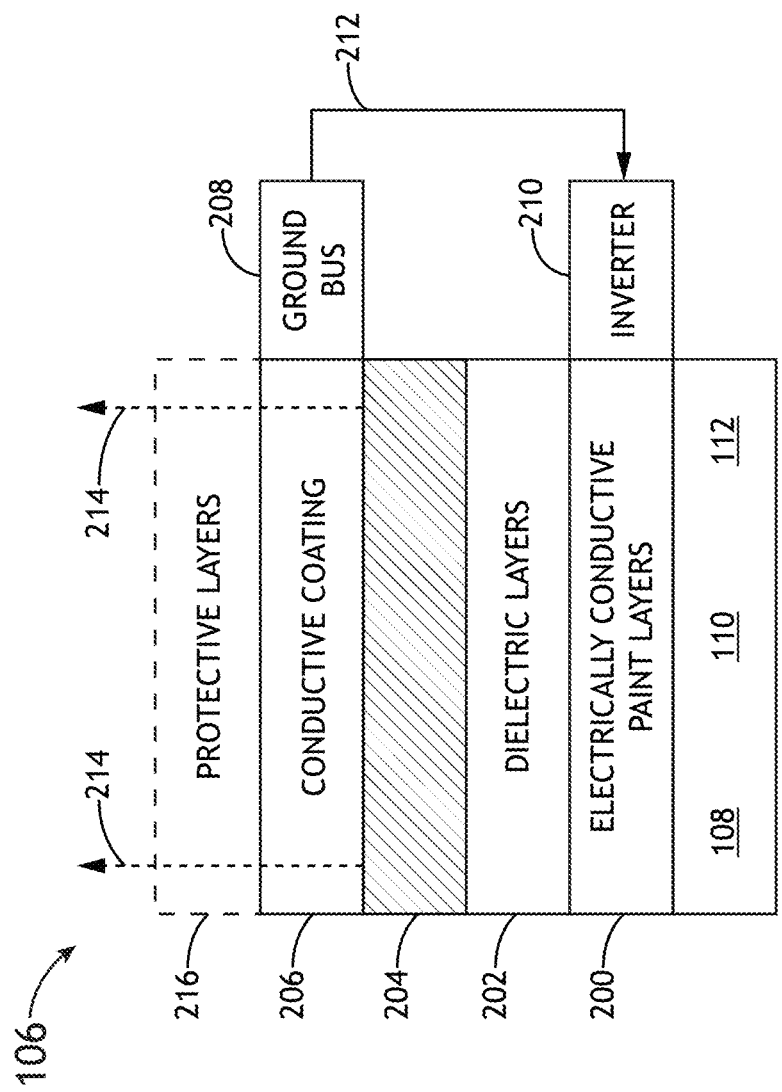
FIG. 2A is an example electroluminescent paint indicator for a fault or failure, in accordance with one or more embodiments of the disclosure.
Figure 2B:
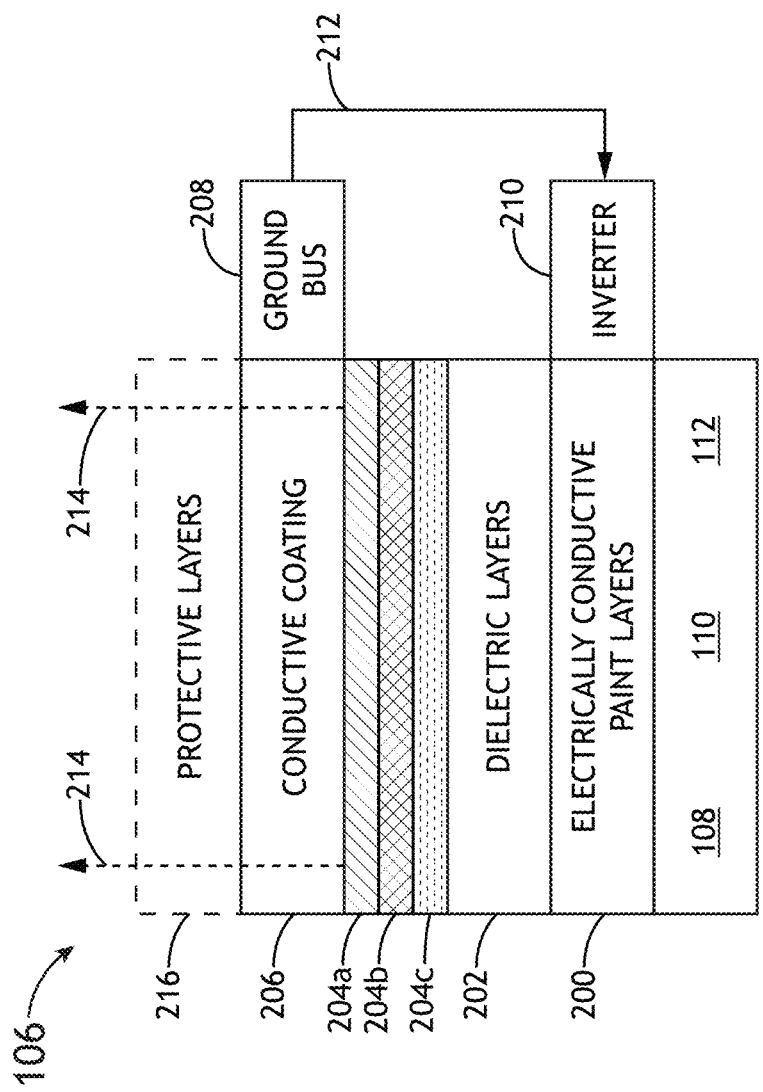
FIG. 2B is an example electroluminescent paint indicator for a fault or failure, in accordance with one or more embodiments of the disclosure.

As illustrated in FIGS. 2A and 2B, an example fault or failure indicator 106 may include an electroluminescent (EL) paint. The electroluminescent paint may be applied to (or disposed on) one or more layers on the surface 108 of the system 100. The electroluminescent paint may be applied to (or disposed on) one or more layers on the surface 110 of a subsystem 102 within the system 100. The electroluminescent paint may be applied to (or disposed on) one or more layers on the surface 112 of a component 104 within the system 100.

The electroluminescent paint may include one or more layers of electrically conductive paint 200. For example, the one or more layers of electrically conductive paint 200 may include an electrically conductive powder. The one or more layers of electrically conductive paint 200 may be applied to (or disposed on) one or more layers on the surface 108 of the system 100. The one or more layers of electrically conductive paint 200 may be applied to (or disposed on) one or more layers on the surface 110 of a subsystem 102 within the system 100. The one or more layers of electrically conductive paint 200 may be applied to (or disposed on) one or more layers on the surface 112 of a component 104 within the system 100.

The one or more layers of electrically conductive paint 200 may be transparent. For example, the one or more layers of electrically conductive paint 200 may be transparent and clear. By way of another example, the one or more layers of electrically conductive paint 200 may be transparent and tinted. It is noted herein, however, that the one or more layers of electrically conductive paint 200 may be opaque or substantially opaque.

The electroluminescent paint may include one or more layers of dielectric material 202. The one or more layers of dielectric material 202 may be applied to (or disposed on) the one or more layers of electrically conductive paint 200.

The electroluminescent paint may include one or more layers of an electroluminescent phosphor compound 204.

The electroluminescent phosphor compound 204 may include electroluminescent phosphor powder and a varnish base. The electrolmuminescent phosphor compound 204 may be applied to (or disposed on) the one or more layers of dielectric material 202. For example, the electroluminescent phosphor powder may be mixed into the varnish base prior to application. In addition, the electroluminescent phosphor powder may be applied to the one or more layers of dielectric material 202 prior to the application of the varnish base. Further, the electroluminescent phosphor powder may be applied to the varnish base following the application of the varnish base to the one or more layers of dielectric material 202.

The electroluminescent phosphor compound 204 may include an electroluminescent phosphor powder applied to (or disposed on) the one or more layers of dielectric material 202 via one or more deposition processes. For example, the one or more deposition processes may include, but are not limited to, a powder coating, an electrostatic coating, a chemical deposition process, a vapor deposition process, or other coating process. In this regard, the electroluminescent phosphor compound 204 may not require a varnish base, as the electroluminescent phosphor powder may not need to be mixed with the varnish base to be applied (or disposed).

The electroluminescent paint may include one or more layers of conductive coating 206. The one or more layers of conductive coating 206 may be applied to (or disposed on) the one or more layers of electroluminescent phosphor compound 204.

The one or more layers of conductive coating 206 may be transparent. For example, the one or more layers of conductive coating 206 may be transparent and clear. By way of another example, the one or more layers of conductive coating 206 may be transparent and tinted. It is noted herein, however, that the one or more layers of conductive coating 206 may be opaque or substantially opaque.

A ground bus 208 may be coupled to (e.g., electrically coupled to) the one or layers of conductive clear coat 206. A power inverter 210 may be coupled to one or more layers of electrically conductive paint 200. A power signal 212 may be provided or transmitted between the ground bus 208 and the inverter 210. For example, the power signal 212 may include an alternating current (AC) signal or a direct current (DC) signal. The power signal 212 may be provided or transmitted in response to a determining of a fault or failure within the system 100.

The electroluminescent paint may include an isolated circuit between non-conductive varnish layers. Providing or transmitting power between the ground bus 208 and the inverter 210 may result in the applying or application of the power to the one or more layers of electrically conductive paint 200 to excite the electroluminescent phosphor powder within the one or more layers of electroluminescent phosphor compound 204. When excited, the one or more layers of electroluminescent phosphor compound 204 may output an illuminated light 214.

The illuminated light 214 may be a select color, the select color defined by a particular type of electroluminescent phosphor powder within the one or more layers of electroluminescent phosphor compound 204. Where the one or more layers of an electroluminescent phosphor compound 204 includes multiple layers (e.g., layers 204a, 204b, 204c, as illustrated in FIG. 2B), at least some of the multiple layers may be configured to provide a different-colored illuminated light 214 when power is provided to the one or more layers of electrically conductive paint 200 (e.g., via the power signal 212). In addition, where the one or more layers of an electroluminescent phosphor compound 204 includes multiple layers (e.g., layers 204a, 204b, 204c, as illustrated in FIG. 2B), at least some combination of the multiple layers may be configured to provide a different-colored illuminated light 214 when power is provided to the one or more layers of electrically conductive paint 200 (e.g., via the power signal 212).

An intensity, brightness, or other characteristics of the illuminated light 214 may be dependent on the provided power signal 212. For example, the higher the power signal 212, the brighter the illuminated light 214. By way of another example, pulsing the power signal 212 with a select pattern may cause a pulsing within the illuminated light 214. It is noted herein, however, that the various characteristics of the illuminated light 214 may be dependent on other factors including, but not limited to, electroluminescent phosphor powder concentration within the one or more layers of electroluminescent phosphor compound 204. Therefore, the above description should not be interpreted as a limitation on the present disclosure but merely an illustration.

The system 100 may be checked to determine whether a fault or failure had occurred in the subsystem 102 and/or the component 104 associated with a fault or failure indicator 106. For example, the illuminated light 214 may be of an intensity or brightness such that it may be viewable up close (e.g., on a runway or manufacturing floor) through visual monitoring of the fault or failure indicator 106 when a grounds crew member is standing next to the system 100. By way of another example, the illuminated light 214 may be of an intensity or brightness such that it may be viewable from an extended distance (e.g., in the sky or on a neighboring hillside or hilltop) on a remote range unit through visual monitoring of the fault or failure indicator 106 through a vision-enhancing device (e.g., binoculars, or the like). Therefore, the above description should not be interpreted as a limitation on the present disclosure but merely an illustration.

One or more protective layers 216 may be applied to (or disposed on) the electroluminescent paint. The one or more protective layers 216 may be applied to (or disposed on) the one or more layers of conductive coating 206. For example, the one or more protective layers 216 may include an epoxy or resin. By way of another example, the one or more protective layers 216 may include one or more layers of varnish. By way of another example, the one or more protective layers 216 may include a transparent or translucent material through which the illuminated light 214 may pass. For instance, the one or more protective layers 216 may be a flexible cover including, but not limited to, a tape or other adhesive-backed flexible cover (e.g., an aircraft exterior grade polyurethane tape, or the like). In addition, the one or more protective layers 216 may include a rigid shell or lens.

The one or more protective layers 216 may serve as both erosion protection and abrasion protection for the fault or failure indicator 106. The one or more protective layers 216 may prevent foreign object debris (FOD) from filling and/or blocking the fault or failure indicator 106. The one or more protective layers 216 may resist wind, rain, snow, or other weather occurrences. In this regard, the fault or failure indicator 106 may be considered "ruggedized."

It is noted herein, however, that the one or more protective layers 216 being an epoxy or resin, a varnish, or a flexible tape may be superior to a more rigid shell or lens. The lens may require a sealant and/or a mechanical coupling mechanism to be affixed, instead of a simple adhesive. The shell or lens may need to be contoured to conform to an adjacent surface. For example, the contouring may include sharp bends. For instance, the sharp bends may refract emitted illumination. In addition, the sharp bends may be susceptible to abrasion and erosion from the Windstream during flight. The lens may also need to survive the harsh environments in the Windstream including, but not limited to, high dynamic flight stresses and differences in thermal expansion between the shell or lens (e.g., which may be fabricated from a plastic) and the adjacent surface (e.g., which may be fabricated from a fiberglass or a metal including, but not limited to, aluminum). Flexure may render a shell or lens unusable as a protective layer, as the flexure may cause the shell or lens to disengage, to break, or the like.

Although embodiments of the disclosure discuss the application (or disposal) or one or more protective layers 216, it is noted herein that the one or more layers of conductive coating 206 may include components configured to protect at least the lower layers 200, 202, 204 of the electroluminescent paint. Therefore, the above description should not be interpreted as a limitation on the present disclosure but merely an illustration.

It is noted herein the electroluminescent paint is not limited to the layers as illustrated in FIGS. 2A and 2B. For example, the electroluminescent paint may include more layers, fewer layers, and/or layers in an order other than the order described with respect to FIGS. 2A and 2B. The electroluminescent paint may include one or more layers configured to provide an undercoating or glow to the electroluminescent paint. For example, the one or more layers configured to provide an undercoating or glow may be positioned between the one or more layers of conductive coating 206 and the one or more layers of electroluminescent phosphor compound 204. The one or more protective layers 216 may be layers of the electroluminescent paint instead of being applied to (or disposed on) the electroluminescent paint. Therefore, the above description should not be interpreted as a limitation on the present disclosure but merely an illustration.

FIGS. 3A-4B generally illustrate example applications of the electroluminescent paint to a surface of the system 100, a subsystem 102, and/or a component 104. The electroluminescent paint may be applied to the system 100 (e.g., the surface 108), a subsystem 102 (e.g., a surface 110), and/or a component 104 (e.g., a surface 112) in any select or pre-defined pattern. For example, the select or pre-defined pattern may include, but is not limited to, spots, bands, patches, labels, graphics, stencils, coatings, or the like. A select or pre-defined pattern of a particular coated area of electroluminescent paint may be contoured to map to a select or pre-defined pattern of an adjacent coated area of electroluminescent paint. It is noted herein, however, that at least one of the multiple coated areas of electroluminescent paint may include a select or pre-defined pattern that is different or independent from other coated areas of electroluminescent paint.

Figure 3A:
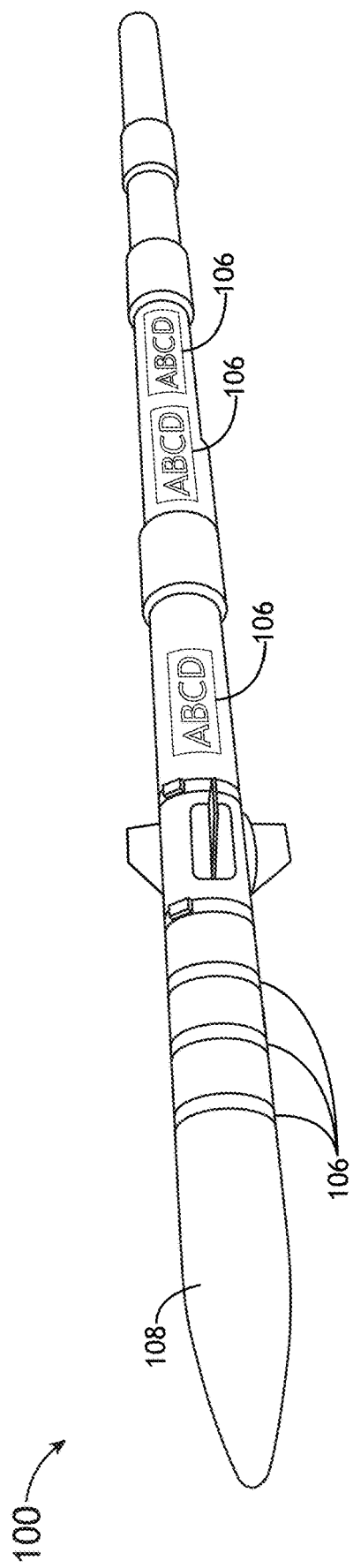
FIG. 3A is an example system including an electroluminescent paint indicator for a fault or failure, in accordance with one or more embodiments of the disclosure.
Figure 3B:
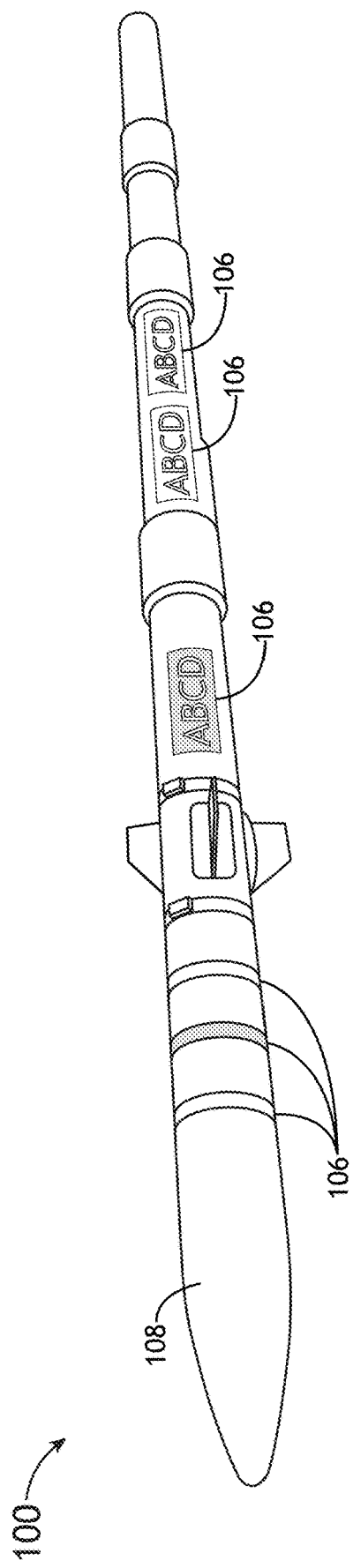
FIG. 3B is an example system including an electroluminescent paint indicator for a fault or failure, in accordance with one or more embodiments of the disclosure.

Referring now to FIGS. 3A and 3B, the electroluminescent paint may be applied to the surface 108 of the system 100. Where there are multiple applications to the surface 108 of the system 100, at least some of the applications of the electroluminescent paint may represent different subsystems 102 and/or components 104 of the system 100 contained within the system 100.

As illustrated in FIG. 3A, all subsystems 102 and/or components 104 may be operating normally. For example, all applications of the electroluminescent paint on the surface 108 of the system 100 may generate an illuminated light 214 of a color corresponding to normal operation. By way of another example, all applications of the electroluminescent paint on the surface 108 of the system 100 may be fully transparent and the electroluminescent paint may not generate any illuminated light, such that the surface 108 of the system 100 may show through the electroluminescent paint.

As illustrated in FIG. 3B, a subsystem 102 and/or a component 104 may be faulty or failing. For example, an application of the electroluminescent paint corresponding to a faulty or failing subsystem 102 and/or component 104 may generate an illuminated light 214 of a color corresponding to a fault or failure, while other applications of the electroluminescent paint may generate an illuminated light 214 of a color corresponding to normal operation. By way of another example, the application of the electroluminescent paint corresponding to the faulty or failing subsystem 102 and/or component 104 may generate the illuminated light 214 of a color corresponding to a fault or failure, while the other applications of the electroluminescent paint may be fully transparent such that the surface of the system 100 may show through the other applications of the electroluminescent paint.

In this regard, the faulty or failing subsystem 102 and/or component 104 may be easily visible due to the generated illuminated light 214 of the color corresponding to a fault or failure when compared to surrounding subsystems 102 and/or components 104.

Figure 4A:
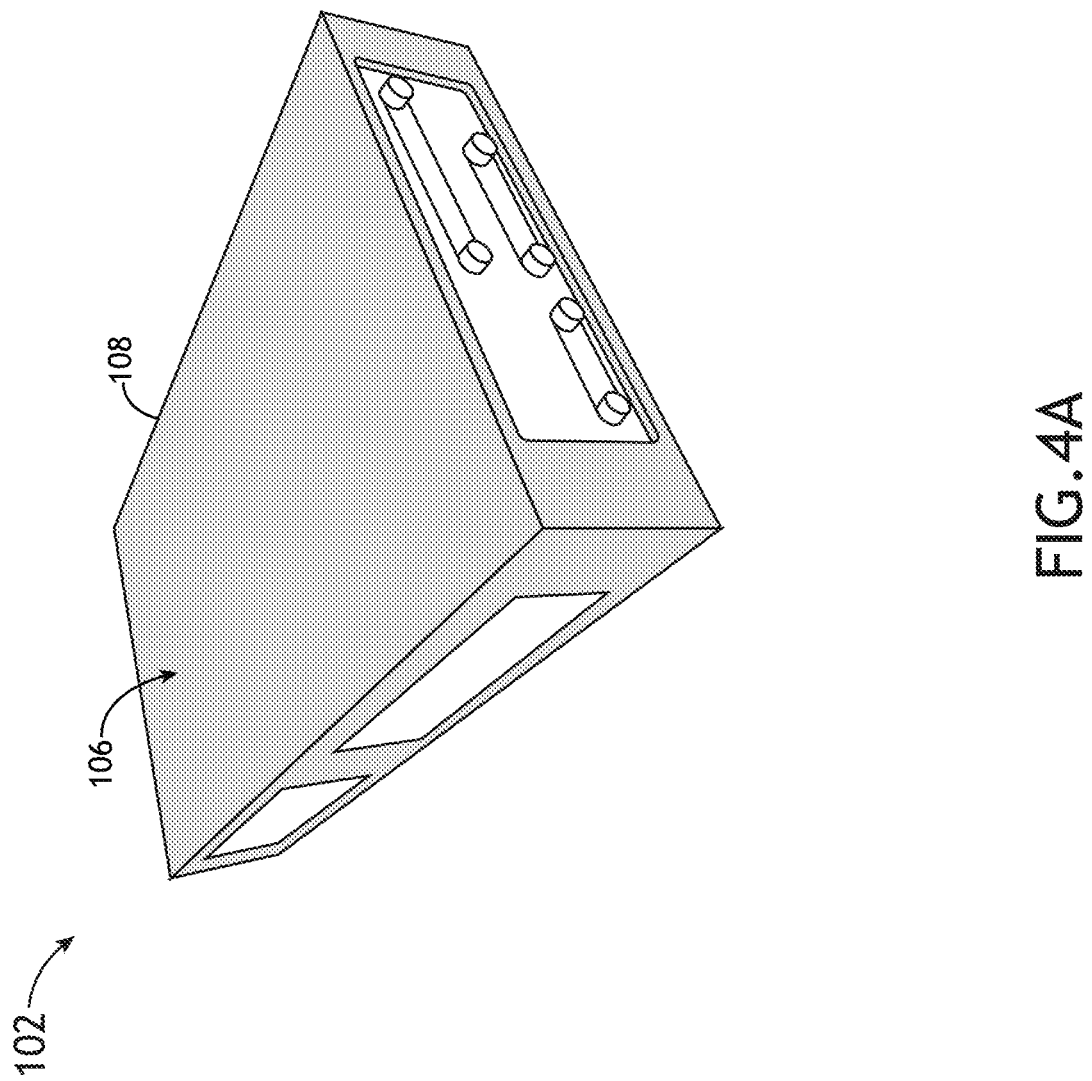
FIG. 4A is an example subsystem including an electroluminescent paint indicator for a fault or failure, in accordance with one or more embodiments of the disclosure.
Figure 4B:
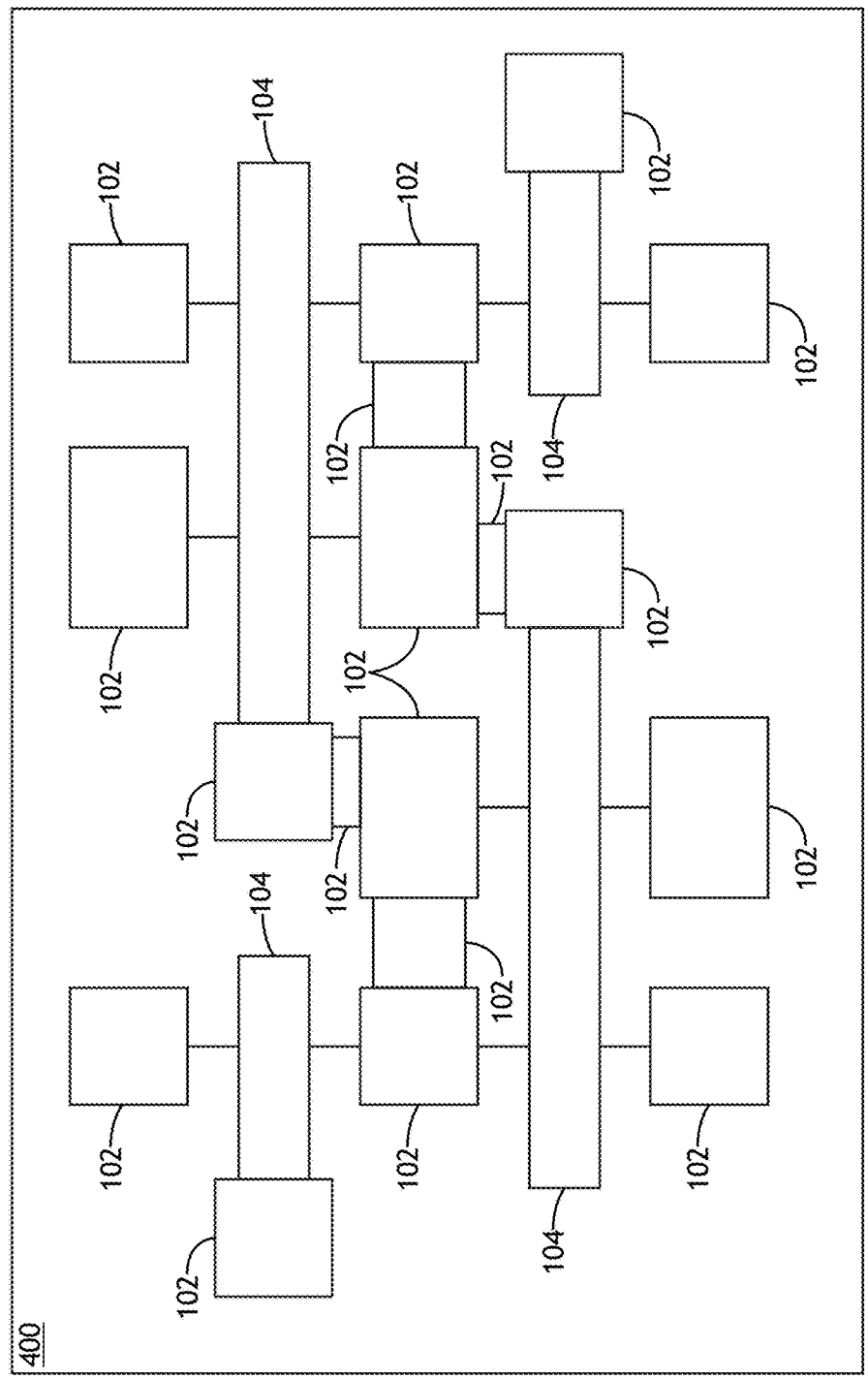
FIG. 4B is an example system including an electroluminescent paint indicator for a fault or failure, in accordance with one or more embodiments of the disclosure.
Figure 4C:
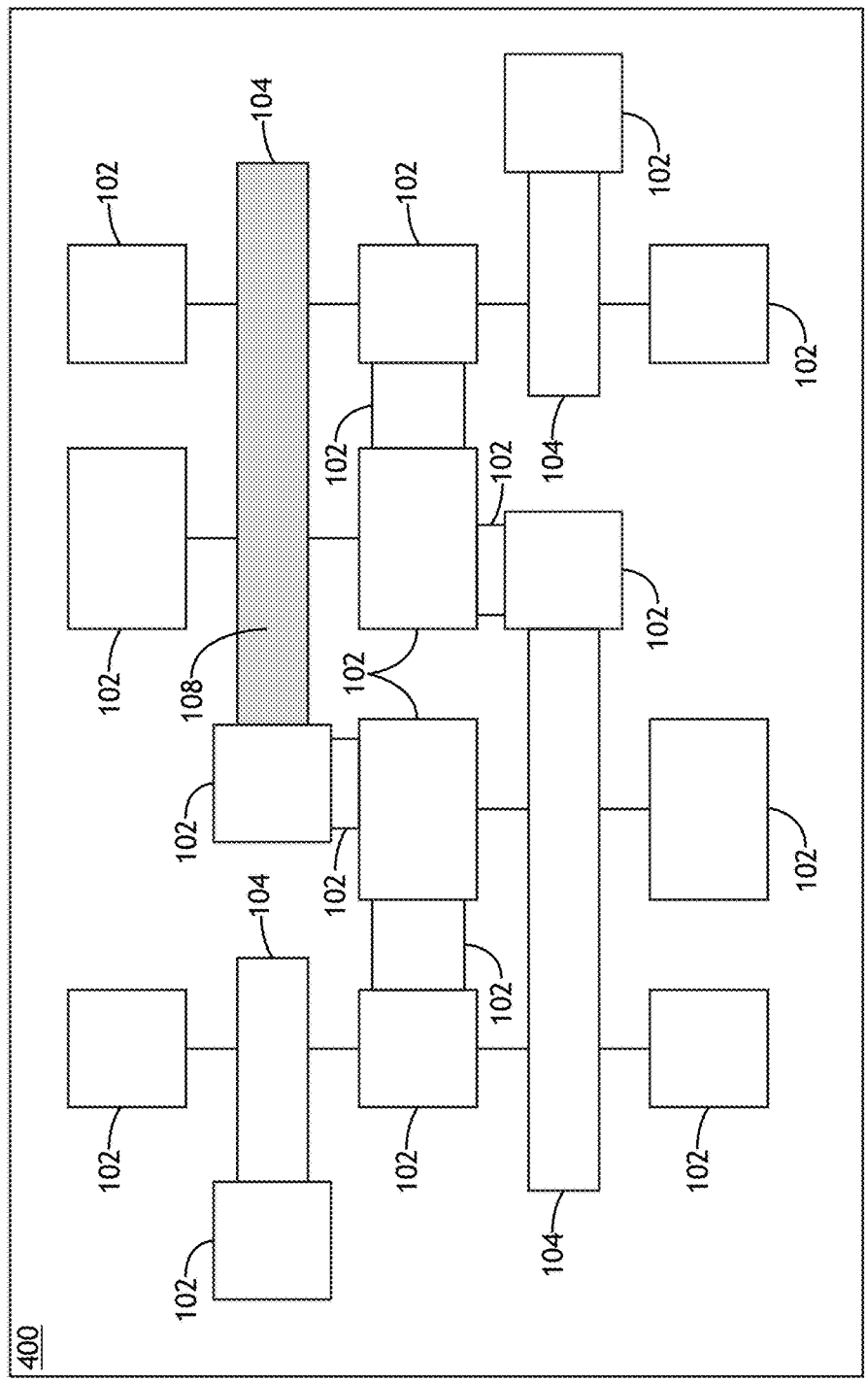
FIG. 4C is an example system including an electroluminescent paint indicator for a fault or failure, in accordance with one or more embodiments of the disclosure.

Referring now to FIGS. 4A-4C, the electroluminescent paint may be applied to a surface 110 of one or more subsystems 102 and/or a surface 112 of one or more components 104, where the subsystem 102 and/or the component 104 are located within an area or defined cavity 400 of the system 100. The electroluminescent paint may be individually applied to (or disposed on) the one or more subsystems 102 and/or the one or more components 104.

As illustrated in FIG. 4A, the subsystem 102 may be faulty or failing. For example, an application of the electroluminescent paint on the surface 110 of the subsystem 102 may generate an illuminated light 214 of a color corresponding to a fault or failure.

As illustrated in FIG. 4B, the component 104 may be operating normally. For example, an application of the electroluminescent paint on the surface 110 of the subsystem 102 and/or the surface 112 of the component 104 may generate an illuminated light 214 of a color corresponding to normal operation. By way of another example, an application of the electroluminescent paint on the surface 110 of the subsystem 102 and/or the surface 112 of the component 104 may be fully transparent and the electroluminescent paint may not generate any illuminated light, such that the surface 110 of the subsystem 102 and/or the surface 112 of the component 104 may show through the electroluminescent paint.

As illustrated in FIG. 4C, the component 104 may be faulty or failing. For example, an application of the electroluminescent paint on the surface 112 of the component 104 may generate an illuminated light 214 of a color corresponding to a fault or failure.

In this regard, the faulty or failing subsystem 102 or component 104 may be easily visible due to the generated illuminated light 214 of the color corresponding to a fault or failure when compared to surrounding subsystems 102 and/or components 104. It is noted herein that the electroluminescent paint may be applied to the surrounding subsystems 102 and/or components 104.

It is noted herein that the fault or failure indicator 106 including an electroluminescent paint may be cost-effective, in terms of material cost and in labor cost. In addition, it is noted herein that the fault or failure indicator 106 including an electroluminescent paint may result in an increased ease visibility in what subsystem 102 and/or component 104 may need to be replaced. The increased ease of visibility may allow for an improved reaction time to faulty or failing elements within the system 100, which may improve fault or failure detection and improve turnaround time (subsequently reducing a Mean Time to Repair).

Although embodiments of the disclosure illustrate applying (or disposing) the electroluminescent paint directly on a surface 108 of the system 100, a surface 110 of a subsystem 102, and/or a surface 112 of a component 104, it is noted herein the electroluminescent paint may be applied to (or disposed on) a removable or fixed element that is couplable to the system 100, the subsystem 102, and/or the component 104. For example, the element may include, but is not limited to, a panel, placard, sticker, or other element including a surface configured to accept an application (or disposing) of the electroluminescent paint. Therefore, the above description should not be interpreted as a limitation on the present disclosure but merely an illustration.

It is noted herein that control of the fault or failure indicator 106 may be accomplished through direct or indirect connection between the power signal 212 and other elements of the system 100. In addition, it is noted herein that the fault or failure indicator 106 may be considered "activated" when the illuminated light 214 is generated, the illuminated light 214 being generated from an excitation of the one or more layers of electroluminescent phosphor compound 204 by the one or more layers of electrically conductive paint 200.

The system 100 may include one or more sensor components 114. For example, the one or more sensor components 114 may include, but are not limited to, one or more electric circuits, one or more sensor devices, one or more sensor mechanisms including electric circuits and/or sensor devices, or the like.

The one or more sensor components 114 may determine whether the system 100 and/or an element within the system 100 is operating normally, or instead is faulty or failing. For example, the one or more sensor components 114 may be installed within the system 100, a subsystem 102, a component 104 of the system 100, or a component 104 of the subsystem 102. It is noted herein that the one or more sensor components 114 may in addition be considered elements of the system 100, for the embodiments of the disclosure.

Figure 1B:
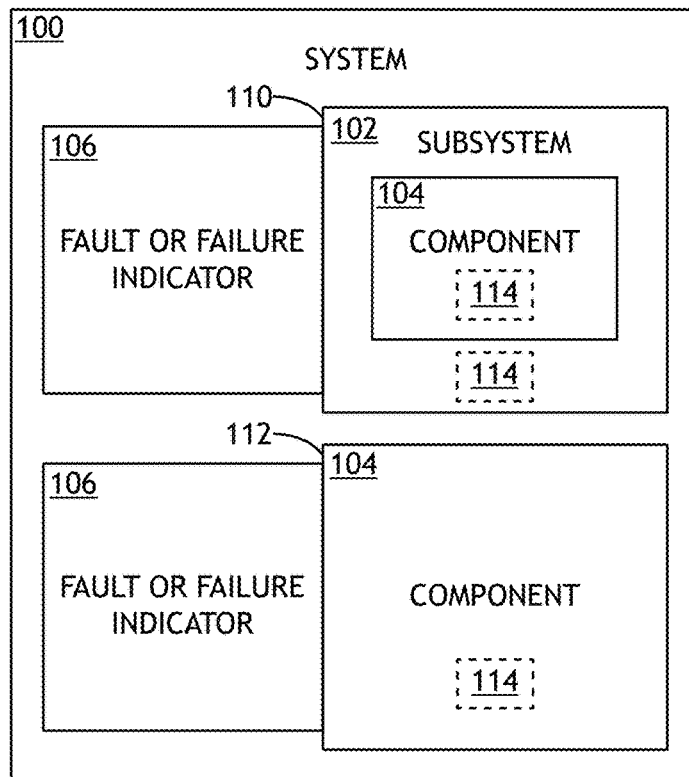
FIG. 1B is a block diagram of a system including an electroluminescent paint indicator for a fault or failure, in accordance with one or more embodiments of the disclosure.

As illustrated in FIGS. 1A and 1B, the one or more sensor components 114 may be configured to interact with the fault or failure indicator 106. For example, the system 100 may be self-monitoring and/or may include a hardware element that trips and activates a counter-circuit including the fault or failure indicator 106. For instance, the one or more sensor components 114 may be configured to control (e.g., activate, deactivate, provide power to, or the like) a fault or failure indicator 106 corresponding to the system 100 or a faulty or failing element within the system 100. In addition, the one or more sensor components 114 may be configured to allow a fault or failure indicator 106 corresponding to the system 100 or a faulty or failing element within the system 100 to activate.

The system 100 may include or be coupled to (e.g., electrically coupled to, physically coupled to, communicatively coupled to, or the like) one or more controllers. The one or more controllers may be configured to monitor the health of the system 100, the one or more subsystems 102, and/or the one or more components 104 (e.g., via the one or more sensor components 114).

Figure 5A:
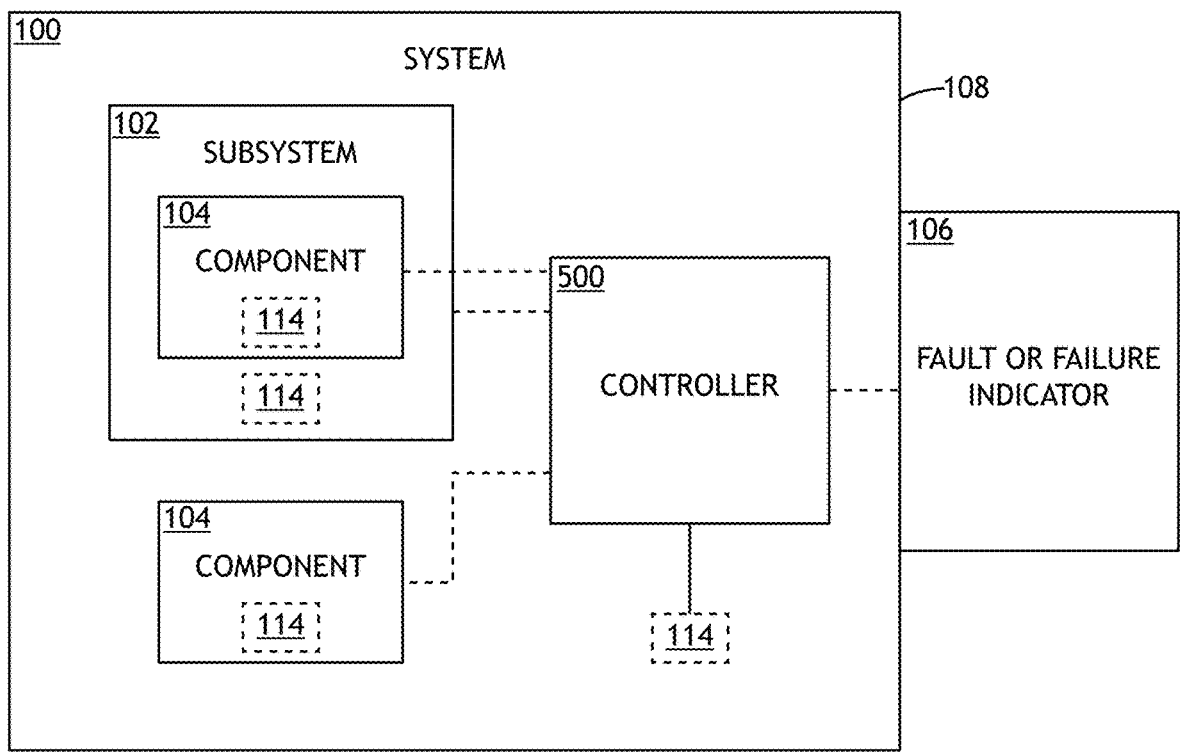
FIG. 5A is a block diagram of a system including an electroluminescent paint indicator for a fault or failure, in accordance with one or more embodiments of the disclosure.
Figure 5B:
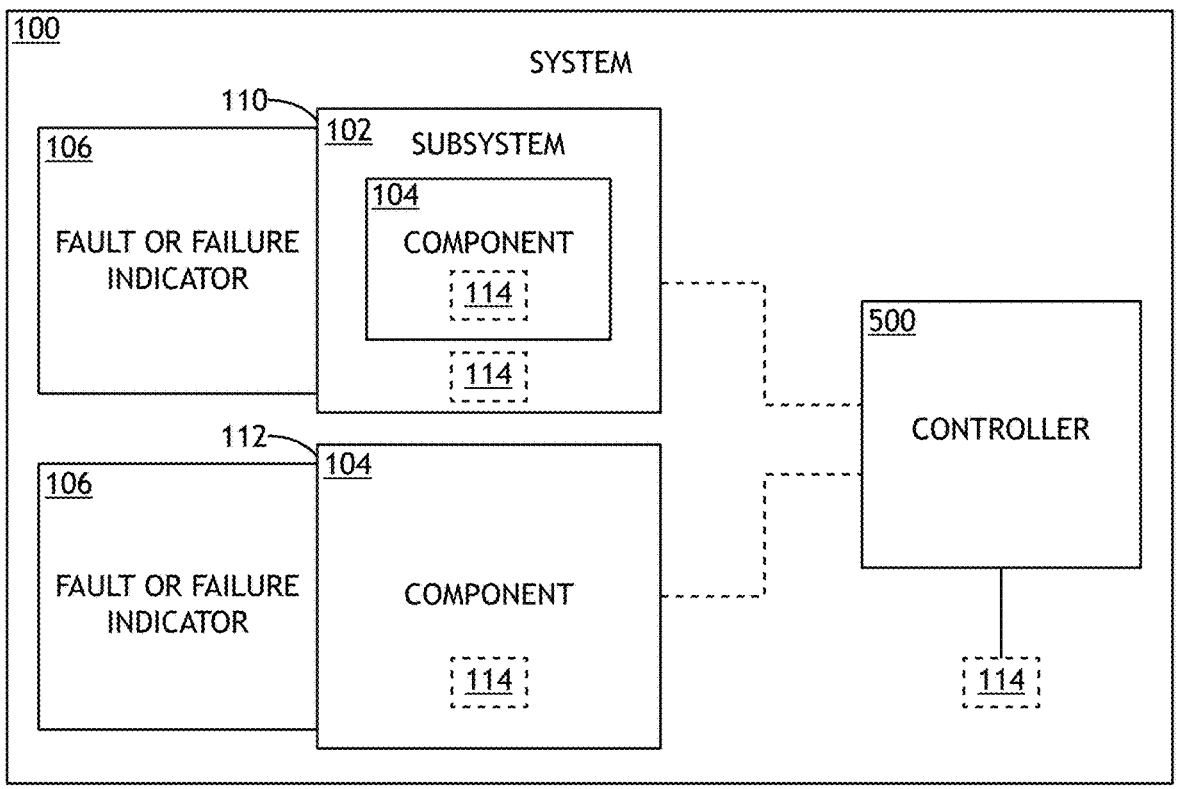
FIG. 5B is a block diagram of a system including an electroluminescent paint indicator for a fault or failure, in accordance with one or more embodiments of the disclosure.

As illustrated in FIGS. 5A and 5B, the system 100 may include one or more controllers 500. The one or more controllers may include one or more processors and memory. The memory may store one or more sets of program instructions. The one or more processors may be configured to execute the one or more sets of program instructions to carry out one or more of the various steps of the processes described throughout the present disclosure. The one or more controllers 500 may include one or more communication interfaces. The one or more controllers 500 may be coupled to one or more display devices. The one or more controllers 500 may be coupled to one or more user input devices. The one or more display devices and the one or more user input devices may be components of one or more user interfaces.

The one or more subsystems 102, the one or more components 104, and/or the one or more controllers 500 may be housed within a common structure. For example, the common structure may include a chassis, a housing, a body, a shell, or other structure capable of containing the one or more controllers 500 and at least some of the one or more subsystems 102 and/or the one or more components 104.

The one or more sensor components 114 may be configured to interact with the one or more controllers 500, and the one or more controllers 500 may be configured to interact with the fault or failure indicator 106. The one or more sensor components 114 may transmit information to the one or more controllers 500, and the one or more controllers 500 may be configured to control (e.g., activate, deactivate, provide power to, or the like) the fault or failure indicator 106 based on the information received from the one or more sensor components 114. For example, a controller 500 may include or may be configured to control a hardware element that trips and activates a counter-circuit including the fault or failure indicator 106. For instance, the one or more sensor components 114 may be configured to transmit a signal to a controller 500 upon a determining of a faulty or failing element, and the controller 500 may transmit a signal to a fault or failure indicator 106 corresponding to the system 100 or a faulty or failing element within the system 100. In addition, the one or more sensor components 114 may be configured to transmit a signal to a controller 500 upon a determining of a faulty or failing element, and the controller 500 may be configured to allow a fault or failure indicator 106 corresponding to the system 100 or a faulty or failing element within the system 100 to activate.

It is noted herein the one or more sensor components 114 may be configured to directly or indirectly (e.g., via the one or more controllers 500) indicate whether attempts have been previously made to fix or otherwise provide maintenance to a system 100, a subsystem 102, and/or a component 104. For example, the one or more sensor components 114 may be configured to illuminate the fault or failure indicator 106 corresponding to the affected system 100, the subsystem 102, and/or the component 104 if access has been detected. It is noted herein the affected system 100, the subsystem 102, and/or the component 104 may be disabled should the illumination of the fault or failure indicator 106 be triggered.

It is noted herein the fault or one or more sensor components 114 may be configured to directly or indirectly (e.g., via the one or more controllers 500) indicate whether the system 100, a subsystem 102, and/or a component 104 is in proximity of select radio frequencies. For example, the select radio frequencies may be harmful to the system 100, the subsystem 102, and/or the component 104.

Although embodiments of the disclosure illustrate the fault or failure indicator 106 as being applied to (or disposed on) a stationary or a non-stationary system 100, a subsystem 102, and/or a component 104, it is noted herein the fault or failure indicator 106 may be applied to (or disposed on) an item worn by a user. For example, the fault or failure indicator 106 may be configured to indicate when a component in possession of the user and/or proximate to the user is faulty or failing. By way of another example, the fault or failure indicator 106 may be configured to indicate when the user is in proximity of select radio frequencies that may be harmful to the user. Therefore, the above description should not be interpreted as a limitation on the present disclosure but merely an illustration.

In this regard, the system 100, one or more subsystems 102, and/or one or more components 104 may be monitored for faults or failure, in an effort to improve Mean Time to Repair (MTTR) should a fault or failure develop. The indicator may not be affected by a hardware failure. The indicator may be visible at the site of the fault or failure. The indicator may be visible proximate to the fault or failure. The indicator may be visible a select distance from the fault or failure.

It is noted herein that one or more components of the system 100 may need to be configured in accordance with aviation guidelines and/or standards put forth by, but not limited to, the Federal Aviation Administration (FAA), the European Aviation Safety Agency (EASA) or any other flight certification agency or organization; the American National Standards Institute (ANSI), Aeronautical Radio, Incorporated (ARINC), or any other standards setting organization or company; the Radio Technical Commission for Aeronautics (RTCA) or any other guidelines agency or organization; or the like.

Although the disclosure been described with reference to the embodiments illustrated in the attached drawing figures, equivalents may be employed and substitutions made herein without departing from the scope of the claims. Components illustrated and described herein are merely examples of a system/device and components that may be used to implement embodiments of the disclosure and may be replaced with other devices and components without departing from the scope of the claims. Furthermore, any dimensions, degrees, and/or numerical ranges provided herein are to be understood as non-limiting examples unless otherwise specified in the claims.

What is claimed:

1. An electroluminescent paint indicator for a fault or failure, comprising:
at least one layer of electrically conductive paint disposed on a surface within a system including the electroluminescent paint indicator;
at least one dielectric layer disposed on the at least one layer of electrically conductive paint;
at least one layer including an electroluminescent phosphor compound disposed on the at least one dielectric layer; and
at least one layer of conductive coating disposed on the at least one layer including the electroluminescent phosphor compound,
the electroluminescent paint indicator being configured to activate following a determination of a fault or failure within the system including the electroluminescent paint indicator,
the activating of the electroluminescent paint indicator comprising:
the at least one layer of electrically conductive paint receiving power;
the at least one layer including the electroluminescent phosphor compound being excited by the at least one layer of electrically conductive paint following the receiving of power; and
the least one layer including the electroluminescent phosphor compound generating an illuminated light following the exciting the at least one layer including the electroluminescent phosphor compound.

2. The electroluminescent paint indicator of claim 1, the electroluminescent phosphor compound including an electroluminescent phosphor powder and a varnish base.

3. The electroluminescent paint indicator of claim 2, the electroluminescent phosphor powder being mixed into the varnish base prior to being disposed on the at least one dielectric layer.

4. The electroluminescent paint indicator of claim 1, the at least one layer of conductive coating being electrically coupled to a ground bus, the at least one layer of electrically conductive paint being electrically coupled to an inverter, the ground bus and the inverter being electrically coupled via a power signal, the at least one layer of electrically conductive paint being configured to receive power via the power signal.

5. The electroluminescent paint indicator of claim 1, the system including one or more sensor components, the one or more sensor components configured to monitor the system to determine the fault or failure within the system.

6. The electroluminescent paint indicator of claim 5, the one or more sensor components being configured to interact with the electroluminescent paint indicator.

7. The electroluminescent paint indicator of claim 5, the one or more sensor components being configured to interact with a controller, the controller being configured to interact with the electroluminescent paint indicator.

8. The electroluminescent paint indicator of claim 1, the system including one or more subsystems.

9. The electroluminescent paint indicator of claim 8, the at least one layer of electrically conductive paint being disposed on a surface of the system, the electroluminescent paint indicator corresponding to a select subsystem of the one or more subsystems, the least one layer including the electroluminescent phosphor compound being configured to generate the illuminated light in response to the excitation by the at least one layer of electrically conductive paint following the determination of a fault or failure in the select subsystem.

10. The electroluminescent paint indicator of claim 8, the at least one layer of electrically conductive paint being disposed on a surface of a select subsystem of the one or more subsystems, the least one layer including the electroluminescent phosphor compound being configured to generate the illuminated light in response to the excitation by the at least one layer of electrically conductive paint following the determination of a fault or failure in the select subsystem.

11. The electroluminescent paint indicator of claim 8, the system including one or more components installed within a select subsystem of the one or more subsystems.

12. The electroluminescent paint indicator of claim 11, the at least one layer of electrically conductive paint being disposed on a surface of the system, the electroluminescent paint indicator corresponding to a select component of the one or more components, the least one layer including the electroluminescent phosphor compound being configured to generate the illuminated light in response to the excitation by the at least one layer of electrically conductive paint following the determination of a fault or failure in the select component.

13. The electroluminescent paint indicator of claim 11, the at least one layer of electrically conductive paint being disposed on a surface of the select subsystem, the electroluminescent paint indicator corresponding to a select component of the one or more components, the least one layer including the electroluminescent phosphor compound being configured to generate the illuminated light in response to the excitation by the at least one layer of electrically conductive paint following the determination of a fault or failure in the select component.

14. The electroluminescent paint indicator of claim 11, the at least one layer of electrically conductive paint being disposed on a surface of a select component of the one or more components, the least one layer including the electroluminescent phosphor compound being configured to generate the illuminated light in response to the excitation by the at least one layer of electrically conductive paint following the determination of a fault or failure in the select component.

15. A method, comprising:
determining a fault or failure within a system, the system including an electroluminescent paint indicator disposed on a surface within the system;
applying electric power to the electroluminescent paint in response to the determination of the fault or failure in the system; and
generating an illuminated light via at least one layer including an electroluminescent phosphor compound of the electroluminescent paint following the applying of the electric power and an exciting of the at least one layer including the electroluminescent phosphor compound of the electroluminescent paint.

* * * * *